United States Patent
Flynn et al.

(10) Patent No.: US 7,326,869 B2
(45) Date of Patent: Feb. 5, 2008

(54) TACTILE FEEDBACK PLUNGER SWITCH

(75) Inventors: Brian Flynn, Huntsville, AL (US);
Kyle Ellison, Huntsville, AL (US); Eric Grigorian, Huntsville, AL (US)

(73) Assignee: Intergraph Hardware Technologies Company, Las Vegas, NV (US)

( * ) Notice: Subject to any disclaimer, the term of this patent is extended or adjusted under 35 U.S.C. 154(b) by 161 days.

(21) Appl. No.: 10/971,529

(22) Filed: Oct. 22, 2004

(65) Prior Publication Data

US 2006/0086599 A1    Apr. 27, 2006

(51) Int. Cl.
*H01H 13/00* (2006.01)

(52) U.S. Cl. .................... 200/341; 200/302.1; 335/205

(58) Field of Classification Search .... 200/16 R–16 D, 200/520, 302.1–302.3, 341–345; 335/205–207
See application file for complete search history.

(56) References Cited

U.S. PATENT DOCUMENTS

| | | | |
|---|---|---|---|
| 3,829,646 A | 8/1974 | Lorteije et al. | 200/159 B |
| 3,999,372 A | 12/1976 | Welch et al. | 58/142 |
| 4,002,871 A | 1/1977 | Sims, Jr. | 200/159 A |
| 4,049,079 A | 9/1977 | Stedman | 182/2 |
| 4,115,723 A | 9/1978 | Byrne et al. | 315/84 |
| 4,227,220 A | 10/1980 | Brown et al. | 360/15 |
| 4,298,778 A * | 11/1981 | Beresford-Jones | 200/302.2 |
| 4,300,129 A | 11/1981 | Cataldo | 340/539 |
| 4,385,219 A | 5/1983 | Finlayson | 200/159 A |
| 4,453,198 A | 6/1984 | Bush et al. | 361/288 |
| 4,597,022 A | 6/1986 | Kusunose | 360/62 |
| 4,773,088 A | 9/1988 | Matheny | 379/395 |
| 4,834,375 A | 5/1989 | Elstein et al. | 273/26 R |
| 4,931,605 A | 6/1990 | Zoller | 200/408 |
| 4,950,922 A * | 8/1990 | Krummer | 307/116 |
| 5,066,841 A | 11/1991 | Zoller et al. | 200/342 |
| 5,113,679 A | 5/1992 | Ferraro et al. | 72/21 |
| 5,365,155 A * | 11/1994 | Zimmermann | 318/268 |
| 5,514,866 A | 5/1996 | Retter | 250/221 |
| 5,669,852 A | 9/1997 | Desautels et al. | 477/111 |

(Continued)

FOREIGN PATENT DOCUMENTS

DE    199 22 638 A1    11/2000

(Continued)

OTHER PUBLICATIONS

"Installation Instructions for VX Series Mechanically Operated Solid State Switches," *Micro Switch—A Honeywell Division*, PK 8779 0, Pages (2).

(Continued)

*Primary Examiner*—Michael A Friedhofer
(74) *Attorney, Agent, or Firm*—Bromberg & Sunstein LLP

(57) ABSTRACT

A tactile feedback switching mechanism having a plurality of switching states. The tactile feedback switching mechanism includes a plunger switch having a plunger. When the plunger is displaced a given distance the switch changes state. A covering lies at least over the plunger switch and includes a border section and a deformation section. The covering may be formed from an elastic material such as an elastomer. When a user depresses the plunger, confirmation of a change in the state of the switch can be tacitly sensed by a change in resistance provided by the covering. The resistance of the covering changes by deformation of the deformation portion of the covering while the plunger is depressed.

15 Claims, 4 Drawing Sheets

U.S. PATENT DOCUMENTS

| | | | | |
|---|---|---|---|---|
| 5,725,086 A | * | 3/1998 | Cooper | 200/302.3 |
| 5,762,738 A | | 6/1998 | Lafond | 156/107 |
| 5,879,267 A | | 3/1999 | Desautels et al. | 477/111 |
| 6,126,429 A | | 10/2000 | Burger et al. | 425/169 |
| 6,278,596 B1 | | 8/2001 | Simpson | 361/42 |
| 6,516,850 B1 | | 2/2003 | Blohowiak | 156/352 |
| 6,609,738 B1 | | 8/2003 | Roth et al. | 292/251.5 |
| 6,677,843 B1 | | 1/2004 | Monroe et al. | 335/205 |
| 6,867,680 B1 | * | 3/2005 | Kulle | 338/32 H |

FOREIGN PATENT DOCUMENTS

| | | |
|---|---|---|
| EP | 0 834 891 A2 | 4/1998 |
| WO | WO 2005/066986 | 7/2005 |

OTHER PUBLICATIONS

International Search Report; dated Jan. 27, 2006; received Feb. 1, 2006; PCT/US2005/033222.

* cited by examiner

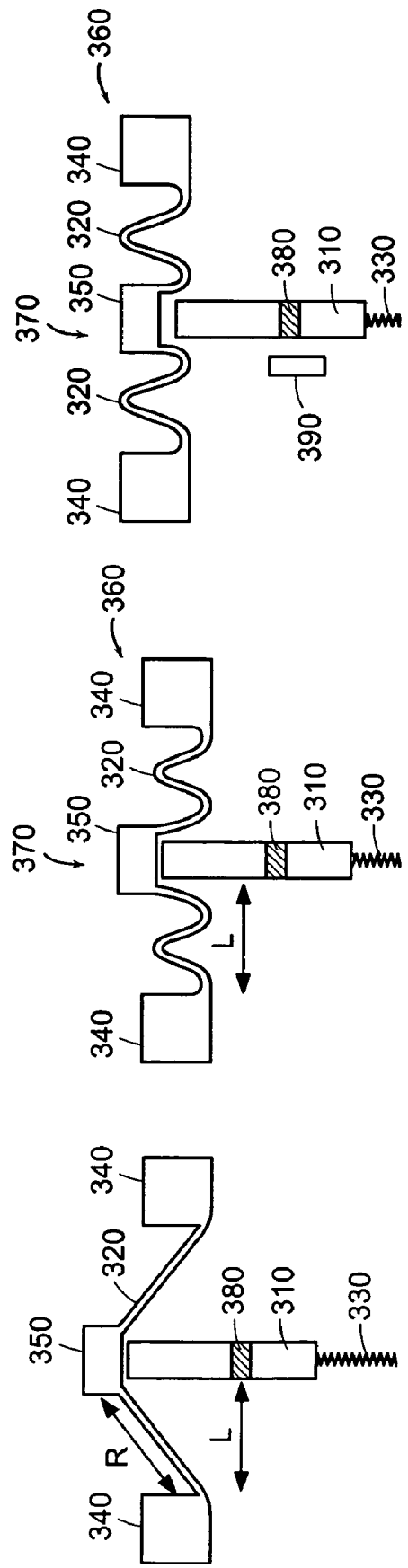

TACTILE FEEDBACK PLUNGER SWITCH

TECHNICAL FIELD AND BACKGROUND ART

The present invention relates to switches and more specifically to plunger switches.

It is known in the prior art to use a toggle switch for user input devices, such as in a keyboard. Toggle switches include two parts: a top that is moveable and a bottom that is stationary. The bottom contains a circuit path that includes a break in the circuit path. The top part of the toggle switch contains a conductive element on its bottom surface, which when depressed, comes into contact with the bottom part and completes the circuit allowing a signal to pass through the circuit. Thus, the circuit path may be closed by toggling the switch. Toggle switches require mechanical contact in order to close the circuit. The disadvantage of the toggle switch is that over repeated use the contacting parts will begin to wear, and the switch will eventually fail.

It is also known in the art to use plunger type switches for switching operations. Plunger switches provide an advantage over toggle switches, because they do not require mechanical contact to close a circuit and therefore, have a longer life expectancy. Plunger switches operate using electromagnetic principles. For example, a Hall Effect plunger switch operates to create a voltage in response to a perpendicular magnetic field, thus producing an output signal.

One problem with plunger type switches that operate in an on-off configuration is that they lack tactile feedback. As a user presses on the plunger which contains a magnet and the plunger passes by a Hall-Effect sensor, there is no sensory indication to the user that the plunger has created a magnetic field and the switch has switched to or from an off-state to an on-state. The only feedback that the user may receive occurs when the plunger bottoms out and physically touches the bottom surface of the housing that holds the plunger. Thus, the plunger needs to be fully depressed for feedback, even though the switch may have changed states at other points during the depression of the plunger. For example, the switch may change states when the plunger is pressed halfway and thus, pressing the plunger the additional halfway so that the plunger contacts the bottom of the housing, wastes the user's energy and may prematurely fatigue a user who must repeatedly push the plunger switch.

SUMMARY OF THE INVENTION

In a first embodiment of the invention there is provided a tactile feedback switching mechanism wherein the switching mechanism has a plurality of switching states. In one embodiment the switching states includes on and off. The switching mechanism has a plunger switch and a covering. The plunger switch changes states using electromagnetic principles and does not require a mechanical connection to change states. In certain embodiments the plunger switch may include a Hall-Effect sensor. The plunger switch includes a plunger that when displaced a given distance changes the state of the switch. The plunger is contained within a switch housing that includes a plunger chamber into which the plunger may be depressed. The plunger includes a magnetic section, which when passed by a Hall-Effect sensor causes an output signal and changes the state of the switch. In one embodiment, the plunger switch is biased by a spring, such that the plunger extends out from the switch housing when no force is applied to the plunger.

Coupled to the plunger switch is a covering that at least lies over the plunger of the plunger switch. When the plunger switch is depressed by a user, a confirmation of a change in state of the switch can be tacitly sensed by the user by a change in the resistance of the covering.

The covering includes three sections: a plunger covering, a deformable section, and a border. In certain embodiments, the covering may be constructed from a single elastic material. In other embodiments the covering is composed of different materials. For example, the plunger cover and the deformable section may be made from an elastic material, while the border is constructed of a rigid plastic. In other embodiments, the covering may be constructed in a molding process wherein different materials and properties are provided for the plunger cover, the deformable section, and the border. For example, the border may be made from a thicker and denser elastic material whereas the deformable section may be made thinner from a resilient elastic material. The border would be constructed from a very thick and non-deforming material. In other embodiments, the covering is an elastomer such as TPE santopreme.

The covering provides an additional resistance to the spring or other biasing device for the plunger as the plunger is depressed by a user. As the plunger is depressed, the resistance from the covering decreases and eventually decreases substantially to a minimal resistance when the switch has changed states. In one embodiment, the resistance decreases substantially when the top of the plunger is substantially parallel with the border of the covering.

In certain embodiments the deformable section completely surrounds the plunger covering and the border completely surrounds the deformable section. When the plunger is in its initial biased position, the length of the deformable section is greater than the distance between the border and the plunger covering. Thus, in certain embodiments the deformable section is convex. As the plunger is pushed downward into the switch housing, the deformable section begins to fold and the resistance added by the covering decreases.

BRIEF DESCRIPTION OF THE DRAWINGS

The foregoing features of the invention will be more readily understood by reference to the following detailed description, taken with reference to the accompanying drawings, in which:

FIGS. 3A-C are images of the covering going through the deformation process when the plunger is depressed;

FIG. 3A shows the covering prior to the plunger being depressed;

FIG. 3B shows the covering mid way through the deformation process when the plunger is depressed;

FIG. 3C shows the covering when the deformation section has completely deformed.

DETAILED DESCRIPTION OF SPECIFIC EMBODIMENTS

Figure 1:
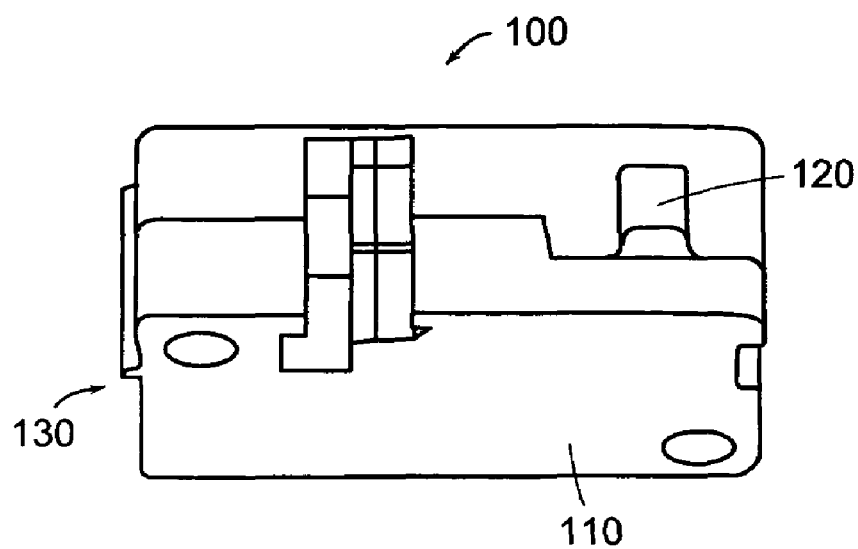
FIG. 1 is an image of a plunger switch.

FIG. 1 is an image of a plunger switch 100. A plunger switch provides a non-mechanical switching mechanism, such that the state of the switch can be changed without mechanical parts having to come into physical contact to complete a circuit path. The plunger switch includes a body 110 that houses the plunger 120. Within the body of the plunger switch are electronics (not shown). The plunger switch 100 includes an output 130 for allowing a signal to be output indicating that the switch has changed states.

One type of plunger switch uses the Hall-Effect to change states. This type of switch includes a Hall-Effect sensor. When the plunger of the switch is depressed into the switch body, a magnetic portion of the plunger creates a magnetic field with the Hall-Effect sensor and a voltage drop typically across a thin layer of silicon. This voltage signal is amplified by internal circuitry and provided to the output 130 of the switch, and the voltage signal is an indicator of a change in state of the switch. Thus, when the magnetic element passes by the Hall-Effect sensor and creates a magnetic field, a voltage is created, and the switch produces an output signal that indicates that the switch has changed states either from the on-state to the off-state or from the off-state to the on-state. In one embodiment, the plunger switch only has two states and the voltage indicates that the switch has changed states. A Hall-Effect plunger switch may have additional circuitry for creating different output signal dependent upon the number of states and their output levels. For example, an output voltage may be 0 Volts if the switch is in an off-state and 3.0 Volts if the switch is in an on-state.

The plunger switch includes a spring. The spring is located between the bottom of the plunger and the base of the switch body. The spring mechanically biases the plunger so that when no force is applied to the top of the plunger, the plunger will return to a position where the plunger is exposed from the switch body.

Figure 2:
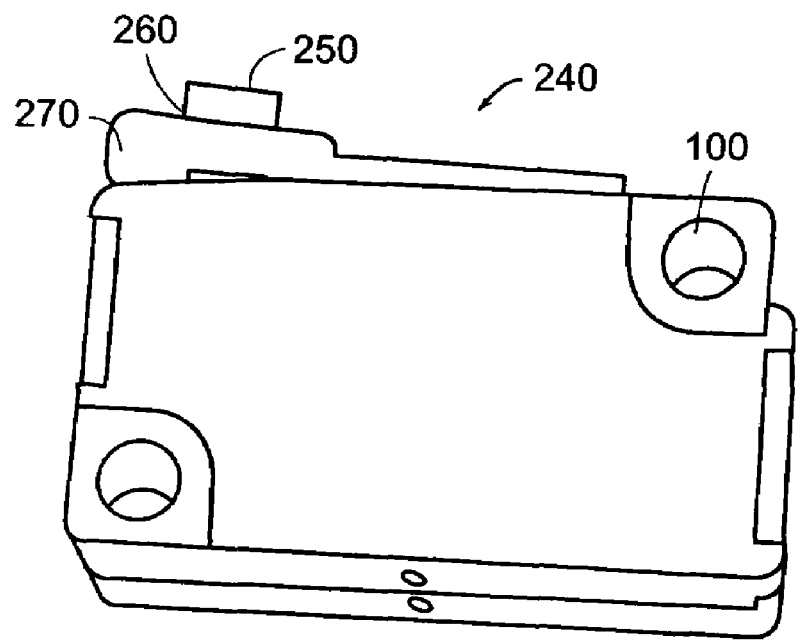
FIG. 2 is a side view of the plunger switch of FIG. 1 with a covering providing tactile feedback during use of the switch.
Figure 2A:
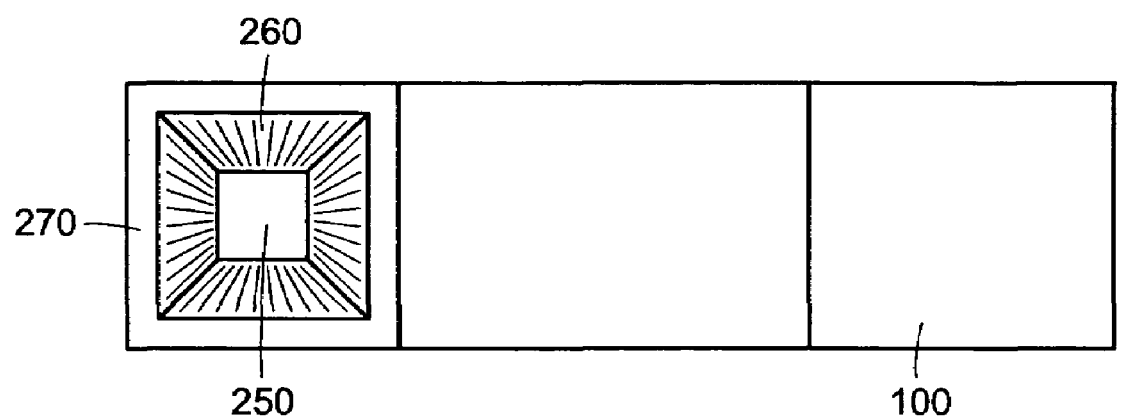
FIG. 2A is a top view of the covering and the plunger switch.

FIG. 2 is a side view of the plunger switch 100 in combination with a covering 240 that provides tactile feedback when a user depresses the plunger switch and FIG. 2A is a top view of the covering 240 and the plunger switch 100. The tactile feedback of the covering alerts the user that the switch has changed states and is the result of a portion of the covering deforming when the plunger is depressed. The covering 240 adds to the resistance provided by the spring of the plunger switch and the covering has a varying resistance as deformation occurs, thus as the covering deforms the resistance lessens and when the covering fully deforms the resistance provided by the covering is very low and inconsequential when compared to the resistance provided by the spring that is biasing the plunger.

The covering includes a plunger cover portion. The plunger cover portion 250 covers the top of the plunger. In the embodiment that is shown in FIG. 2, the plunger is rectangular in shape and so is the plunger cover portion 250 (FIGS. 2 and 2A). In the embodiment that is shown, the covering is made from a continuous piece of molded elastic material. In one embodiment, the covering is formed from a single elastomer, which is TPE santoprene having a durometer of 65. Other elastomers may be used to make the covering including thermoplastic elastomers. The plunger cover portion 250 is thicker than the elastic material that is adjacent to the plunger cover portion which is called the deformable section 260. In one embodiment, the plunger cover portion 250 is made of a thicker material that will not deform when the plunger is depressed. The deformable section 260 surrounds the plunger cover portion and is defined by a border 270. The border 270 is thicker than that of the deformable section and will not deform while the plunger is being pressed downward. In other embodiments, the plunger cover portion 250, the deformable portion 260 and the border 270 may each be formed from different material. For example, the deformable portion 260 could be bonded to the border portion where the border portion is constructed of metal. In other embodiments, each part of the elastic covering may be formed from different elastic materials exhibiting different elastic properties. For example, each section of the covering may be made from an elastomer, however each section may have a different durometer rating.

The deformable section deforms as pressure is placed on the plunger, and the plunger is pushed in. FIGS. 3A-C illustrate the manner in which the deformable section deforms. As previously indicated, the covering adds resistance to the plunger in addition to the resistance provided by the spring that biases the plunger. As the deformable section deforms, less and less additional resistance is provided by the covering, and therefore, there is a point in the deformation process where the additional resistance is minimal. The loss in resistance is felt by the user who is pushing on the plunger, and thus, this change in resistance, is associated with the plunger switch changing states. The point of maximum deformation, the added resistance is approximately zero. The deformation section is designed such that the maximum deformation occurs either when the magnetic portion of the plunger creates a magnetic field with the Hall-effect sensor or after the voltage signal has been produced by the plunger switch indicating a change in states. Thus, the deformation and the change in state coincides.

FIG. 3A shows a side slice view of the elastic covering and the plunger. In this FIG., the plunger 310 is at its bias point fully extended above the switch housing and a user has not placed any force on the plunger. The deformable section 320 is bowed upward by the tension from the biasing spring 330. The border 340 section of the elastic covering is attached to the deformable section 320 and is attached to the plunger switch through bonding or some form of adhesive. In other embodiments, the border section 340 may not be directly attached to the plunger switch. For example, the elastic covering may be formed in a mold and may include an additional elastic section beyond the border that attaches to the plunger switch. Such an embodiment can be seen in FIG. 2 and FIG. 4 (discussed below). The border section 340 is thicker than the deformable section 320 and the thickness is sized such that during deformation, the border section 340 will not bend or deform. The plunger cover section 350 is also thicker than the deformable section. The plunger cover section 350 covers the plunger 310 and also does not deform when the plunger is depressed due to its thickness. In one embodiment, the deformable section 320 completely surrounds the plunger cover and the border completely surrounds the deformable section. Thus, the border section 340 defines a border in which the deformable section 320 resides and the plunger cover section 350 resides within the deformable section.

The border for the deformable section may be any shape, including but not limited to, a square, a rectangle or a circle. It should be understood by one of ordinary skill in the art that other configuration are possible. For example, the border section may be divided into linear or curvilinear segments that surround the deformation section, but are not contiguously attached, without deviating from the scope of the invention.

In order to provide tactile user feedback when the switch has changed states, a designer of such an elastic covering can vary the border shape, the size of the deformable section and the materials that are used, especially the material and thickness of the material for the deformable section. The deformable section undergoes a change in resistance, which provides the tactile feedback, and therefore, the resistance curve and the manner in which it changes can be varied from application to application. As stated, the resistance curve can be varied in a variety of ways including increasing or decreasing the thickness of the deformable section, changing the shape of the deformable section, changing the ratio between the length R and L of the deformable section and changing the geometric shape of the deformable section. In the embodiment that is shown, the geometric shape of the deformable section is substantially dome-shaped, however the shape may be more or less angular.

FIG. 3B shows a side slice view of the plunger 310 and elastic covering 360 wherein a force 370 has been placed on the plunger 310 and the plunger 310 has been depressed. The plunger 310 is depressed about half the distance, from the location at which the switch changes states. The deformable section 320 begins to fold because the length of the deformable section R (as shown in FIG. 3A) is greater than the spatial length L between the border 340 and the plunger cover section 350. As the material deforms, the resistance in the deformable material reduces due to the folding of the material and this loss in resistance is sensed by the user who is depressing the plunger. The border section 340 and the plunger covering 350 do not significantly deform during the depression of the plunger 310 as compared to the deformable section 320.

FIG. 3C shows the plunger 310 fully depressed such that the magnetic portion 380 of the plunger 310 is sensed by the Hall-Effect sensor 390. In this state, the deformable section 320 has completely deformed and there is little to no resistance provided by the elastic cover. Thus, as the elastic cover deforms the resistance rapidly falls. The user of the plunger switch senses the decrease in resistance and thereby knows that the switch has changed states. There is no need for the user to press the plunger further and have the plunger bottom-out on the switch housing or to full depress the spring. Once the user removes his finger from the plunger, the spring 330 will cause the elastic covering 360 to return to the state shown in FIG. 3A.

Figure 4:
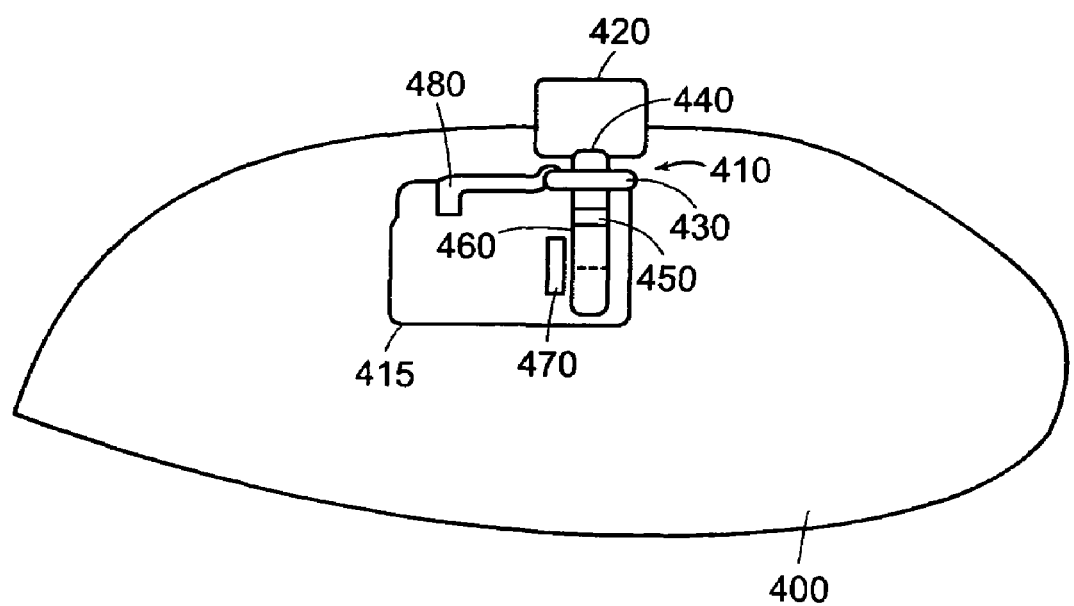
FIG. 4 shows the covering in use with the plunger switch and user input device, such as a button.

FIG. 4 is a side view of a user input device 400 wherein the plunger switch 415 is coupled to the elastic covering and the elastic covering 410 is coupled to a button 420 of the user input device 400. As a user presses down on the button 420, the underside of the button contacts the elastic covering 410 causing the deformable section to deform. The plunger covering travels with the plunger as the deformable section deforms folding in on itself within the region between the border section 430 and the plunger covering 440. When the magnetic portion 450 of the plunger 460 aligns with the Hall-Effect sensor 470, the deformable section is fully deformed and the resistance due to the elastic covering is at a minimum. Thus, the user who is pressing the button tactilely senses the change in state of the plunger switch without the plunger switch having to mechanically engage with the bottom surface of the plunger housing.

As shown in FIG. 4, there is additional elastic material 480 that is attached to the elastic covering. This additional elastic material is attached to the plunger switch 415 and couples the elastic covering 410 and the plunger switch 415. The bond between the elastic covering 410 and the plunger switch 415 may be formed using any known connecting technique, including sonic welding, and adhesion.

The present invention as expressed above may be embodied in other specific forms without departing from the true scope of the invention. The described embodiments are to be considered in all respects only as illustrative and not restrictive.

What is claimed is:

1. A tactile feedback switching mechanism having a plurality of switching states comprising:
   a plunger switch including a plunger that when displaced a given distance changes switching states, wherein the plunger switch includes a body into which the plunger may be depressed, the plunger switch switching states prior to the plunger engaging the bottom of the body;
   a covering wherein the covering lies at least over the plunger and wherein when the plunger switch is depressed by the user, confirmation of a change in the state of the switch can be tacitly sensed by the user by a change in resistance provided by the covering, wherein the resistance provided by the covering varies as the covering deforms between a first covering state and second covering state and wherein the resistance provided by the covering is significantly reduced in the second state which corresponds with a location at which a magnetic portion of the plunger aligns with a Hall-Effect sensor.

2. The tactile feedback switching mechanism according to claim 1, wherein the covering includes a plunger covering that lies over the plunger and the covering includes a raised border.

3. The tactile feedback switching mechanism according to claim 2 wherein the covering is made of an elastic material.

4. The tactile feedback switching mechanism according to claim 3, wherein the border of the covering is separated from the plunger covering by a deformable region.

5. The tactile feedback switching mechanism according to claim 4, wherein when the plunger is not depressed, the deformable region is raised with respect to the border.

6. The tactile feedback switching mechanism according to claim 4, wherein the deformable section folds during depression of the plunger.

7. The tactile feedback switching mechanism according to claim 4, wherein the border section does not deform when the plunger is depressed.

8. The tactile feedback switching mechanism according to claim 1 wherein the plunger switch includes a spring for biasing the plunger so that the plunger is exposed outside of the switch housing when no pressure is placed on the plunger.

9. The tactile feedback switching mechanism according to claim 8, wherein the plunger switch switches state prior to the spring being completely compressed.

10. The tactile feedback switching mechanism according to claim 1, wherein the plunger switch changes states when the magnetic portion of the plunger aligns with the Hall-Effect sensor.

11. An apparatus providing tactile feedback for use with a plunger switch, the apparatus comprising:
    an elastic covering wherein the elastic covering includes a plunger portion that lies at least over a plunger of the plunger switch and wherein when the plunger switch includes a body and is depressed by the user, confirmation of a change in the state of the switch can be tacitly sensed by the user by a change in resistance of the elastic covering due to deformation of at least a portion of the elastic covering, wherein the resistance provided by the covering varies as the covering deforms between a first covering state and second covering state and wherein the resistance provided by the covering is significantly reduced in the second state which corresponds with a location at which a magnetic portion of the plunger aligns with a Hall-Effect sensor, the plunger switch switching states prior to the plunger engaging the bottom of the body.

12. An apparatus according to claim 11, wherein the elastic covering includes a plunger covering section that covers the plunger, a border section surrounding the plunger covering section and a deformable section positioned between the border section and the plunger covering section.

13. The apparatus according to claim 12, wherein when the covering is placed adjacent the plunger switch the border section does not deform when the plunger covering section is depressed.

14. The apparatus according to claim 12, wherein the elastic covering is created from a plurality of elastic materials.

15. The apparatus according to claim 14 wherein the border section and the deformable section are made from different elastic materials.

* * * * *